(12) United States Patent
Lee

(10) Patent No.: US 8,198,003 B2
(45) Date of Patent: Jun. 12, 2012

(54) PHOTOSENSITIVE PASTE COMPOSITION, BARRIER RIB PREPARED USING THE COMPOSITION AND PLASMA DISPLAY PANEL COMPRISING THE BARRIER RIB

(75) Inventor: Beom-Wook Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 715 days.

(21) Appl. No.: 12/039,665

(22) Filed: Feb. 28, 2008

(65) Prior Publication Data

US 2008/0220368 A1 Sep. 11, 2008

(30) Foreign Application Priority Data

Mar. 6, 2007 (KR) .................. 10-2007-0022143

(51) Int. Cl.
*G03F 7/004* (2006.01)
(52) U.S. Cl. ............... 430/270.1; 430/281.1; 430/287.1
(58) Field of Classification Search ............... 430/270.1, 430/281.1, 908, 287.1, 918, 927
See application file for complete search history.

(56) References Cited

U.S. PATENT DOCUMENTS

| | | | |
|---|---|---|---|
| 6,197,480 B1 | 3/2001 | Iguchi et al. | |
| 6,576,391 B1 | 6/2003 | Iguchi et al. | |
| 7,585,611 B2 | 9/2009 | Kato et al. | |
| 2002/0008470 A1* | 1/2002 | Uegaki et al. | 313/567 |
| 2006/0071202 A1* | 4/2006 | Lee et al. | 252/514 |
| 2006/0166113 A1 | 7/2006 | Lee et al. | |
| 2008/0026320 A1* | 1/2008 | Lee et al. | 430/270.1 |

FOREIGN PATENT DOCUMENTS

| | | |
|---|---|---|
| CN | 1325038 A | 12/2001 |
| CN | 1746770 A | 3/2006 |
| EP | 1 158 019 A2 | 11/2001 |
| JP | 09-059544 | 3/1997 |
| JP | 09-304922 | 11/1997 |
| JP | 09-310030 | 12/1997 |
| JP | 10-144213 | 5/1998 |
| JP | 10-198028 | 7/1998 |
| JP | 2002-214772 | 7/2002 |
| JP | 2004-318116 | * 11/2004 |
| JP | 2007-010885 | 1/2007 |
| JP | 2008-003599 | 1/2008 |
| KR | 1020040002472 A | 1/2004 |
| WO | WO 2006/004158 A1 | 1/2006 |

OTHER PUBLICATIONS

Machine translation of JP 2004-318116, published on Nov. 11, 2004.*
European Search Report dated Jul. 18, 2008, for corresponding European application 08250763.3.
KIPO Office action dated Feb. 7, 2009 for priority Korean application 10-2007-0022143.
Japanese Office action dated Jun. 15, 2010, for corresponding Japanese Patent application 2008-056851.
SIPO Office action dated Jun. 9, 2011, for corresponding Chinese Patent application 200810083302.4, with English translation, 20 pages.
SIPO Office Action dated Dec. 7, 2011 for the corresponding Chinese Application 200810083302.4, with English translation, 11 pages.

* cited by examiner

*Primary Examiner* — Anca Eoff
(74) *Attorney, Agent, or Firm* — Christie, Parker & Hale, LLP

(57) ABSTRACT

Photosensitive paste compositions, barrier ribs of plasma display panels (PDPs) including the same, and PDPs including the barrier ribs are provided. More particularly, a photosensitive paste composition includes an organic component and an inorganic component, where the organic component and the inorganic component each have an average refractive index of less than 1.5. The organic component used in the photosensitive paste composition is not harmful to the human body, is inexpensive, is generally easily obtained, and succumbs readily to thermal decomposition. Accordingly, using such an organic component, barrier ribs of PDPs having high resolution and high compactness by exposure to light only once can be prepared.

26 Claims, 1 Drawing Sheet

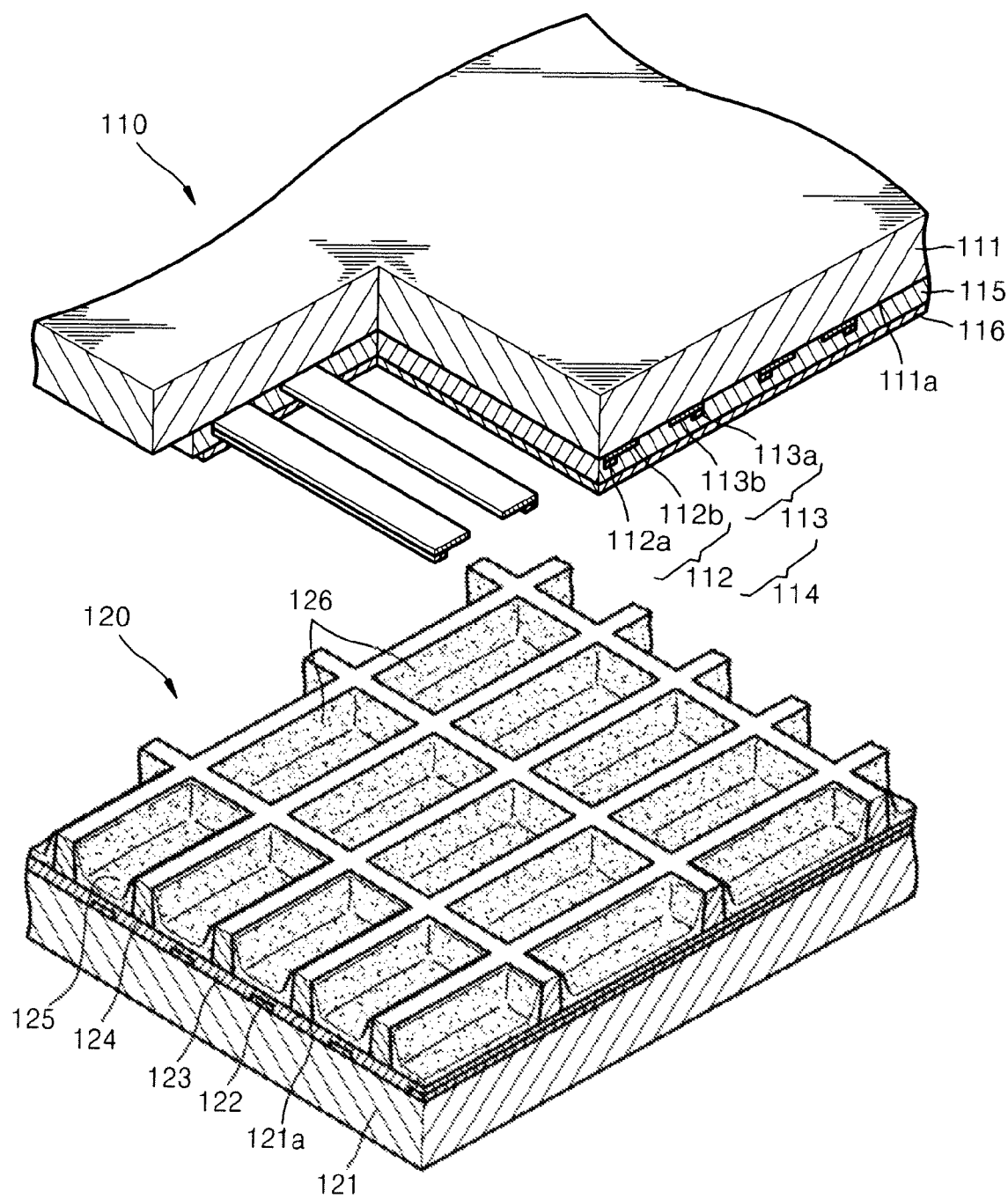

PHOTOSENSITIVE PASTE COMPOSITION, BARRIER RIB PREPARED USING THE COMPOSITION AND PLASMA DISPLAY PANEL COMPRISING THE BARRIER RIB

CROSS-REFERENCE TO RELATED PATENT APPLICATION

This application claims priority to and the benefit of Korean Patent Application No. 10-2007-0022143, filed on Mar. 6, 2007 in the Korean Intellectual Property Office, the entire content of which is incorporated herein by reference.

BACKGROUND OF THE INVENTION

1. Field of the Invention

The present invention relates to photosensitive paste compositions, to barrier ribs of plasma display panels (PDPs) including the same and to PDPs including the barrier ribs.

2. Description of the Related Art

FIG. 1 illustrates a typical plasma display panel (PDP). Referring to FIG. 1, a PDP includes a front panel 110 and a rear panel 120. The front panel 110 includes a front substrate 111; sustain electrode pairs 114 formed on a rear surface 111a of the front substrate 111, where each sustain electrode pair 114 includes a Y electrode 112 and an X electrode 113; a front dielectric layer 115 covering the sustain electrode pairs; and a protective layer 116 covering the front dielectric layer 115. The Y electrode 112 and the X electrode 113 include transparent electrodes 112b and 113b respectively, where the transparent electrodes 112b and 113b are made of ITO, etc.; and bus electrodes 112a and 113a, each including a black electrode (not shown) for contrast enhancement and a white electrode (not shown) for imparting conductivity. The bus electrodes 112a and 113a are connected to connection cables disposed on the left and right sides of the PDP.

The rear panel 120 includes a rear substrate 121; address electrodes 122 formed on a front surface 121a of the rear substrate 121 which intersect the sustain electrode pairs; a rear dielectric layer 123 covering the address electrodes; a barrier rib 124 formed on the rear dielectric layer 123 to partition discharge cells 126; and a phosphor layer 125 disposed in each discharge cell. The address electrodes are connected to connection cables disposed on upper and lower sides of the PDP.

In PDPs, barrier ribs are structures formed on the rear panel (or rear substrate), which define discharge spaces and prevent electrical or optical crosstalk between adjacent discharge cells. Such barrier ribs have various shapes (e.g. stripes or matrices) and sizes (i.e., width and pitch) depending on the type of PDP.

The barrier ribs are formed on the dielectric layer covering the address electrodes on the lower substrate of the PDP using a screen printing method, a sand blasting method, etching, photolithography, or the like.

When forming a barrier rib using a screen printing method, a barrier rib paste for printing is printed on a substrate using a patterned mask and a squeegee and then dried to remove solvent. The printing and drying are repeated several times to obtain a film with a desired thickness. The obtained film is sintered to thereby form a barrier rib. However, this method is time-consuming, and makes it difficult to form a uniformly patterned barrier rib due to misalignment and repeated printing, and the resulting barrier rib has low resolution.

When forming a barrier rib using a sand blasting method, a barrier rib paste is printed once on a substrate by a table coater and then dried to obtain a film with a desired thickness. A dry film resist with sanding resistance is then laminated on the film and patterned through exposure to light and development. Then, micro-abrasive sandblasting is performed under high pressure using the dry film resist pattern as a mask to obtain a patterned film. The residual dry film resist is removed and the patterned film is sintered to complete a barrier rib. Although a barrier rib formed by sandblasting has higher resolution than one formed by screen printing, the sandblasting method is a complicated process and causes damage to electrode terminals due to collision with abrasive sand.

Etching is a similar to sand blasting. However, unlike in sand blasting, in etching, a barrier rib is formed by pattering a sintered membrane using an etching solution. Using the etching method, high resolution can be obtained, but the manufacturing cost is high.

When forming a barrier rib using photolithography, a photosensitive paste is printed and dried to form a film with a desired thickness. The film is exposed to UV light by a UV exposure system equipped with a photomask. The printing, drying, and exposure are repeated several times. Development is then performed to selectively remove an unexposed region. Sintering is then performed to obtain a barrier rib. Photolithography can form a barrier rib with higher resolution than that formed by screen printing. Also, unlike sandblasting, photolithography does not require a dry film resist and a sanding process. However, photolithography requires many processes and misalignment occurs due to the repeated processes.

To address these problems, a method has been proposed to minimize the difference between the refractive indices of an organic component and an inorganic component by using an organic component having a high refractive index and an inorganic component having a low refractive index. This minimizes the number of preparation processes. However, the binder used in such a method includes an aromatic group and a Br atom to obtain the high refractive index. These materials have bad pyrolytic properties and are harmful to the human body. The binder also includes a cross-linking agent having a high refractive index, which includes a S atom, and thus is difficult to be synthesized and is expensive.

SUMMARY OF THE INVENTION

In one embodiment of the present invention, a photosensitive paste composition includes an organic component that is not harmful to the human body, is inexpensive, is generally easily obtained, and succumbs readily to thermal decomposition. The photosensitive paste composition is exposed to light only once and is used to make a barrier rib pattern having high resolution and high compactness.

In another embodiment of the present invention, a barrier rib of a plasma display panel (PDP) is prepared using the photosensitive paste composition. In yet another embodiment, a PDP includes the barrier rib.

According to an embodiment of the present invention, a photosensitive paste composition includes an organic component and an inorganic component, wherein the organic component and inorganic component each have an average refractive index of less than about 1.5.

BRIEF DESCRIPTION OF THE DRAWINGS

The above and other features and advantages of the present invention will become more apparent by reference to the following detailed description when considered in conjunction with the following drawing in which:

FIG. 1 is a partially exploded perspective view of a typical plasma display panel (PDP).

DETAILED DESCRIPTION OF THE INVENTION

In one embodiment of the present invention, a photosensitive paste composition includes an organic component and an inorganic component. The organic component may include a binder, a cross-linking agent, a photo initiator and an additive. The inorganic component may include a low melting point glass frit and a high melting point glass frit.

The organic component may be present in an amount ranging from about 20 to about 70 parts by volume with respect to 100 parts by volume of the photosensitive paste composition. When the organic component is present in an amount less than about 20 parts by volume with respect to 100 parts by volume of the photosensitive paste composition, printing properties and exposure sensitivity deteriorate. When the organic component is present in an amount greater than about 70 parts by volume with respect to 100 parts by volume of the photosensitive paste composition, the shrinkage ratio of the barrier rib is so high that the shape of the barrier rib is deformed.

The binder and cross-linking agent in the organic component each include only an aliphatic group, and do not include an aromatic group such as a benzene or naphthalene ring or the like, and each have a refractive index of less than about 1.5.

The binder may include a resin soluble in an alkali developing solution. More particularly, the binder may include an acryl-based resin having a carboxyl group. The acryl-based resin is inexpensive and facilitates control of properties according to changes in the composition of components. In addition, the acryl-based resin having a carboxyl group makes it possible for developing to be performed in an aqueous alkali solution, makes it easier for inorganic components to be dispersed in the photosensitive paste composition, and provides appropriate viscosity and elasticity.

The acryl-based resin having a carboxyl group can be prepared by copolymerization of a monomer having a carboxyl group and a monomer having an ethylenically unsaturated group. Nonlimiting examples of suitable monomers having a carboxyl group include acrylic acid, methacrylic acid, fumaric acid, maleic acid, vinylacetic acid, anhydrides thereof, and combinations thereof. Nonlimiting examples of suitable monomers having an ethylenically unsaturated group include methyl(meth)acrylate, ethyl(meth)acrylate, n-propyl (meth)acrylate, isopropyl(meth)acrylate, n-butyl(meth)acrylate, sec-butyl(meth)acrylate, isobutyl(meth)acrylate, tert-butyl(meth)acrylate, n-pentyl(meth)acrylate, allyl(meth) acrylate, butoxyethyl(meth)acrylate, butoxytriethyleneglycol(meth)acrylate, cyclohexyl(meth) acrylate, dicyclopentanyl(meth)acrylate, dicyclopentenyl (meth)acrylate, 2-ethylhexyl(meth)acrylate, glycerol(meth) acrylate, glycidyl(meth)acrylate, isobornyl(meth)acrylate, isodecyl(meth)acrylate, isooctyl(meth)acrylate, lauryl(meth) acrylate, 2-methoxyethyl(meth)acrylate, methoxyethyleneglycol(meth)acrylate, methoxydiethyleneglycol(meth)acrylate, stearyl(meth)acrylate, 2-hydroxyethyl(meth)acrylate, 2-hydroxypropyl(meth)acrylate, aminoethyl(meth)acrylate, combinations thereof, and the like.

In addition, the binder has a cross-linkable group formed by reacting the carboxylic group of the copolymer with an ethylenically unsaturated compound. Nonlimiting examples of suitable ethylenically unsaturated compounds include acryloyl chloride, methacryloyl chloride, allyl chloride, glycidyl acrylate, glycidyl methacrylate, 3,4-epoxycyclohexylmethyl acrylate, and 3,4-epoxycyclohexylmethyl methacrylate.

In addition, the copolymer can be used alone as the binder. However, for the purpose of enhancing film leveling or thixotropic properties, a mixture of the copolymer with another material is used. Nonlimiting examples of suitable materials to mix with the copolymer include cellulose, methyl cellulose, ethyl cellulose, n-propyl cellulose, hydroxyethyl cellulose, 2-hydroxyethyl cellulose, methyl-2-hydroxyethyl cellulose, hydroxypropyl cellulose, hydroxypropylmethyl cellulose, hydroxybutylmethyl cellulose, hydroxypropylmethyl cellulose phthalate, cellulose nitrate, cellulose acetate, cellulose triacetate, cellulose acetate butyrate, cellulose acetate propionate, cellulose propionate, (acrylamidomethyl) cellulose acetate propionate, (acrylamidomethyl)cellulose acetate butyrate, cyanoethylated cellulose, pectic acid, chitosan, chitin, carboxymethylcellulose, carboxymethylcellulose sodium salts, carboxyethylcellulose, and carboxyethylmethylcellulose.

The copolymer may have a weight average molecular weight ranging from about 5,000 to about 50,000 g/mol and an acid value ranging from about 50 to about 250 mgKOH/g. If the weight average molecular weight of the copolymer is less than about 5,000 g/mol, the viscosity of the paste is so low that in the process of preparing the paste, printing properties deteriorate. If the weight average molecular weight of the copolymer is greater than about 500,000 g/mol, the developing speed is too slow or developing is not achieved. In addition, if the acid value of the copolymer is less than about 50 mgKOH/g, the developing properties deteriorate. If the acid value of the copolymer is greater than 250 mgKOH/g, even exposed regions may be developed.

The binder may be present in an amount ranging from about 30 to about 80 parts by weight with respect to 100 parts by weight of the organic component. When the binder is present in an amount less than about 30 parts by weight with respect to 100 parts by weight of the organic component, the coating properties and dispersibility of the paste are reduced. When the binder is present in an amount greater than about 80 parts by weight with respect to 100 parts by weight of the organic component, the cross-linking reaction is insufficiently performed during exposure to light, and thus a pattern having a desired shape is difficult to obtain.

Nonlimiting examples of suitable cross-linking agents include mono(meth)acrylates, multi-functional (meth)acrylates and combinations thereof. Nonlimiting examples of suitable mono(meth)acrylates include (meth)acrylic acid, methyl(meth)acrylate, ethyl(meth)acrylate, n-propyl(meth) acrylate, isopropyl(meth)acrylate, n-butyl(meth)acrylate, sec-butyl(meth)acrylate, isobutyl(meth)acrylate, tert-butyl (meth)acrylate, n-pentyl(meth)acrylate, allyl(meth)acrylate, butoxyethyl(meth)acrylate, butoxytriethyleneglycol(meth) acrylate, cyclohexyl(meth)acrylate, dicyclopentanyl(meth) acrylate, dicyclopentenyl(meth)acrylate, 2-ethylhexyl(meth) acrylate, glycerol(meth)acrylate, glycidyl(meth)acrylate, isobornyl(meth)acrylate, isodecyl(meth)acrylate, isooctyl (meth)acrylate, lauryl(meth)acrylate, 2-methoxyethyl(meth) acrylate, methoxyethyleneglycol(meth)acrylate, methoxydiethyleneglycol(meth)acrylate, stearyl(meth)acrylate, 2-hydroxyethyl(meth)acrylate, 2-hydroxypropyl(meth)acrylate, aminoethyl(meth)acrylate, and the like. Nonlimiting examples of suitable multi-functional (meth)acrylates include di(meth)acrylates (such as 1,6-hexanediol di(meth) acrylate, (ethoxylated) 1,6-hexanediol di(meth)acrylate, 1,4-butanediol di(meth)acrylate, 2-butyl-2-ethyl-1,3-propanediol di(meth)acrylate, 1,9-nonanediol di(meth)acrylate, tripropyleneglycol di(meth)acrylate, dipropyleneglycol di(meth)acrylate, and tetraethyleneglycol di(meth)acrylate), tri(meth)acrylates (such as trimethylolpropane tri(meth)acrylate, (ethoxylated) trimethylolpropane tri(meth)acrylate, (propoxylated) glycerin tri(meth)acrylate, pentaerythritol tri(meth)acrylate, and (propoxylated) trimethylolpropane-3-tri(meth)acrylate), tetra(meth)acrylates (such as ditrimethylolpropane tetra(meth)acrylate, tetramethylolpropane tetra(meth)acrylate, and pentaerythritol tetra(meth)acrylate), penta(meth)acrylates (such as dipentaerythritol penta(meth)acrylate), hexa(meth)acrylates (such as dipentaerythritol hexa(meth)acrylate), and the like.

The cross-linking agent may be present in an amount ranging from about 20 to about 70 parts by weight with respect to 100 parts by weight of the organic component. When the cross-linking agent is present in an amount less than about 20 parts by weight with respect to 100 parts by weight of the organic component, light exposure sensitivity is reduced. When the cross-linking agent is present in an amount greater than about 70 parts by weight with respect to 100 parts by weight of the organic component, the barrier rib may become disconnected or detached during sintering.

As for the photo initiator, commercially well-known compounds may be used. Although these compounds may contain aromatic groups, only small amounts of the photo initiator are used, so the refractive index and pyrolytic properties are hardly affected. Nonlimiting examples of suitable photo initiators include benzophenone, o-benzoyl benzoic acid methyl ester, 4,4-bis(dimethylamino)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropan-1-one, 2-benzyl-2-dimethylamino-1-(4-morpholinophenyl)-butan-1-one, bis(2,6-dimethoxybenzoyl)-2,4,4-trimethylpentylphosphineoxide, bis(2,4,6-trimethylbenzoyl)phenylphosphineoxide, and combinations thereof.

The photo initiator may be present in an amount ranging from about 0.5 to about 20 parts by weight with respect to 100 parts by weight of the organic component. When the photo initiator is present in an amount less than about 0.5 parts by weight with respect to 100 parts by weight of the organic component, light exposure sensitivity is reduced. When the photo initiator is present in an amount greater than about 20 parts by weight with respect to 100 parts by weight of the organic component, even non-exposed regions are not developed.

The organic component can further include an additive if needed. Nonlimiting examples of suitable additives include sensitizers for improving sensitivity, polymerization inhibitors and antioxidants for improving storage stability of the photosensitive paste compound, ultraviolet absorbents for improving resolution, antifoaming agents for reducing air bubbles in the composition, dispersants for improving dispersibility, leveling agents for improving smoothness of the membrane during printing, plasticizers for improving thermal decomposition characteristics, thixotropic agents for providing thixotropic characteristics, and the like.

In addition, the organic component can include a solvent for adjusting viscosity. A suitable solvent is one that can dissolve the binder and the photo initiator, that can be satisfactorily mixed with the cross-linking agent and additives, and that has a boiling point of about 150° C. or greater. When the boiling point of the solvent is less than about 150° C., the possibility of volatilization is high during preparation of the photosensitive paste compound, particularly in a 3-roll mill process, and the solvent is volatilized so quickly during printing that the print state is not good. Nonlimiting solvents satisfying these criteria include ethyl carbitol, butyl carbitol, ethyl carbitol acetate, butyl carbitol acetate, texanol, terpine oil, diethylene glycol, dipropylene glycol, tripropylene glycol, dipropyleneglycol methylether, dipropyleneglycol ethylether, dipropyleneglycol monomethylether acetate, γ-butyrolactone, cellosolve acetate, butyl cellosolve acetate, and combinations thereof.

The amount of the solvent is not particularly limited, but the solvent should be used in an amount sufficient to provide a viscosity of the paste that is suitable for printing or coating.

The inorganic component may be present in an amount ranging from about 30 to about 80 parts by volume with respect to 100 parts by volume of the photosensitive paste composition. When the inorganic component is present in an amount less than about 30 parts by volume with respect to 100 parts by volume of the photosensitive paste composition, the shrinkage ratio of the barrier rib is so high during sintering that the shape of the barrier rib is deformed. When the inorganic component is present in an amount greater than about 80 parts by volume with respect to 100 parts by volume of the photosensitive paste composition, printing properties and light exposure sensitivity deteriorate. In addition, during sintering, the low melting point glass frit in the inorganic component is sintered and thus forms a compact barrier rib membrane, and the high melting point glass frit in the inorganic component maintains the shape of the barrier rib membrane.

The low melting point glass frit has an average refractive index of less than about 1.52. In one embodiment, the low melting point glass frit includes a complex oxide having at least three oxides selected from oxides of Si, B, Al, Ba, Zn, Mg, Ca, P, V, Mo, Te, and the like, though the low melting point glass frit is not limited thereto. In another embodiment, the low melting point glass frit may include a compound selected from $SiO_2$—$B_2O_3$—$Al_2O_3$ based glasses, $SiO_2$—$B_2O_3$—BaO based glasses, $SiO_2$—$B_2O_3$—CaO based glasses, ZnO—$B_2O_3$—$Al_2O_3$ based glasses, ZnO—$SiO_2$—$B_2O_3$ based glasses, $P_2O_5$ based glasses, SnO—$P_2O_5$ based glasses, $V_2O_5$—$P_2O_5$ based glasses, $V_2O_5$—$Mo_2O_3$ based glasses, $V_2O_5$—$P_2O_5$—$TeO_2$ based glasses, and the like. As used herein, "$P_2O_5$ based glasses" and similar terms refer to glasses having at least the named component (e.g. $P_2O_5$), but that can include other components (e.g. oxides). For example, a P2O5 based glass may include $P_2O_5$ in addition to other oxides. In addition, the low melting point glass frit can be used alone or in combination with at least two other complex oxides.

The low melting point glass frit can also include a compound containing fluorine (F). For example, the low melting point glass frit may include a compound selected from $SiO_2$—$B_2O_3$—$Al_2O_3$—F based glasses, $SiO_2$—$B_2O_3$—BaO—F based glasses, $SiO_2$—$B_2O_3$—CaO—F based glasses, ZnO—$B_2O_3$—$Al_2O_3$—F based glasses, ZnO—$SiO_2$—$B_2O_3$—F based glasses, $P_2O_5$—F based glasses, SnO—$P_2O_5$—F based glasses, $V_2O_5$—$P_2O_5$—F based glasses, $V_2O_5$—$Mo_2O_3$—F based glasses, $V_2O_5$—$P_2O_5$—$TeO_2$—F based glasses, and the like. In addition, the low melting point glass frit can be used alone or in combination with at least two other compounds.

The particle shape of the low melting point glass frit is not particularly limited, but may be almost spherical. The nearer to spherical the particle shape of the low melting point glass frit, the more improved the packing ratio and ultraviolet ray transmittance characteristics.

The particle diameter of the low melting point glass frit may have a median value $D_{50}$ ranging from about 2 to about 5 μm, a minimum value $D_{min}$ of about 0.1 μm or greater, and a maximum value $D_{max}$ of less than about 20 μm. When the median value $D_{50}$ is less than about 2 μm, or the minimum value $D_{min}$ is less than about 0.1 μm, dispersibility of the low melting point glass frit is reduced, thus deteriorating printing properties and increasing the shrinkage ratio during sintering so that a barrier rib having the desired shape is difficult to obtain. When the median value $D_{50}$ is greater than about 5 μm, or the maximum value $D_{max}$ is greater than about 20 um, the compactness of the barrier rib and the straightness of the shape of the barrier rib are adversely affected.

A softening temperature $T_s$ of the low melting point glass frit may satisfy Equation 1 below.

Sintering temperature−80° C.<$T_s$<sintering temperature  Equation 1

When the softening temperature of the low melting point glass frit is less than the sintering temperature −80° C., the shape of the barrier rib is deformed during sintering. When the softening temperature of the low melting point glass frit is greater than the sintering temperature, sintering is not fully performed.

The low melting point glass frit may be present in an amount ranging from about 60 to about 95 parts by volume with respect to 100 parts by volume of the inorganic component. When the low melting point glass frit is present in an amount less than about 60 parts by volume with respect to 100 parts by volume of the inorganic component, sintering is not fully performed. When the low melting point glass frit is present in an amount greater than about 95 parts by volume with respect to 100 parts by volume of the inorganic component, the shape of the barrier rib is deformed during sintering.

The high melting point glass frit in the inorganic component may be various kinds of materials having an average refractive index of less than about 1.50. The high melting point glass frit may include, but is not limited to, a complex oxide comprising at least two selected from oxides of Si, B, Al, Ba, Zn, Mg, Ca, and the like. The high melting point glass frit can be used alone or in combination with two other complex oxides. In one embodiment, the high melting point glass frit may include a compound selected from $SiO_2$—$B_2O_3$ based glasses, $SiO_2$—$B_2O_3$—$Al_2O_3$ based glasses, $SiO_2$—$B_2O_3$—BaO based glasses, $SiO_2$—$B_2O_3$—CaO based glasses, $SiO_2$—$B_2O_3$—MgO based glasses, $SiO_2$—$Al_2O_3$—BaO based glasses, $SiO_2$—$Al_2O_3$—CaO based glasses, $SiO_2$—$Al_2O_3$—MgO based glasses, and the like.

The particle shape of the high melting point glass frit is not particularly limited, but may be almost spherical. The nearer to spherical the particle shape of the low melting point glass frit, the more improved the packing ratio and ultraviolet ray transmittance characteristics.

The particle diameter of the high melting point glass frit may have a median value $D_{50}$ ranging from about 1 to about 4 μm, a minimum value $D_{min}$ of about 0.1 μm or more, and a maximum value $D_{max}$ of about 20 μm or less. When the median value is less than about 1 μm, or the minimum value is less than about 0.1 μm, light exposure sensitivity is reduced, and the shrinkage ratio of the barrier rib is increased during sintering so that a barrier rib having the desired shape is difficult to obtain. When the median value is greater than about 5 μm, or the maximum value is greater than about 20 um, the compactness of the barrier rib and the straightness of the shape of the barrier rib are adversely affected.

A softening temperature $T_s$ of the high melting point glass frit may satisfy Equation 2 below.

$T_s$>sintering temperature+20° C.  Equation 2

When the softening temperature of the high melting point glass frit is sintering temperature +20° C. or less, the shape of the barrier rib is deformed during sintering.

The high melting point glass frit may be present in an amount ranging from about 5 to about 40 parts by volume with respect to 100 parts by volume of the inorganic component. When the high melting point glass frit is present in an amount less than about 5 parts by volume with respect to 100 parts by volume of the inorganic component, the shape of the barrier rib is deformed during sintering. When the high melting point glass frit is present in an amount greater than about 40 parts by volume with respect to 100 parts by volume of the inorganic component, sintering is not fully performed.

According to another embodiment of the present invention, a photosensitive paste composition can be prepared by the following procedure.

First, a solvent is added to a blending tank, and an initiator and additive are added thereto to form a mixture. Then, the mixture is stirred to dissolve the initiator and additive. Next, a binder solution in which a resin is dissolved is added to the blending tank and stirred. A cross-linking agent is then added thereto and the mixture is stirred. When the resulting mixture is completely mixed, the mixed solution is filtered using SUS mesh #600 to prepare an organic component of a photosensitive paste composition.

The prepared organic component is mixed with an inorganic component to prepare a paste. The paste is prepared by adding inorganic powder to a planetary mixer (PLM) and slowly adding the organic component thereto while stirring. When the mixture is completely mixed, the mixture is mechanically mixed by 3-roll milling 3 to 5 times. When the process of 3-roll milling is terminated, the resulting product is filtered using SUS mesh #400, and then degassed using a vacuum pump to prepare a photosensitive paste composition.

According to another embodiment of the present invention, a barrier rib of a plasma display panel (PDP) is prepared using the photosensitive paste composition.

A method of preparing a barrier rib of a PDP using the photosensitive paste composition is as follows. The photosensitive paste composition prepared as described above is coated on a lower substrate of a PDP on which address electrodes and a dielectric layer are formed. The photosensitive paste composition is coated by screen printing or by a table coater, and dried in a dry oven or an IR oven at a temperature ranging from about 80 to about 120° C. for from about 5 to about 60 minutes to remove the majority of solvent from the photosensitive paste composition. Then, light of a certain wavelength is irradiated onto the dried film of the prepared paste using an ultraviolet exposure device in which a photomask is installed. Thus, a portion of the dried film onto which ultraviolet rays are irradiated becomes insoluble in the developing solution through cross-linking. In the developing process, an appropriate alkaline developer (such as a $Na_2CO_3$ solution, a KOH solution, a TMAH solution, a monoethanolamine solution, and the like) that is diluted in pure water is used at a developing temperature of about 30° C. to remove unexposed portions of the photosensitive paste. As a result, a pattern is obtained. The resulting product is sintered in an electric furnace at a temperature ranging from about 500 to about 600° C. for from about 5 to about 60 minutes to remove any remaining organic components and to sinter inorganic frits. Accordingly, a patterned film can be obtained.

In the process of forming a barrier rib pattern described above, even when photolithography is performed using conventional organic compounds used in conventional photosensitive paste compositions, barrier rib patterns with high resolution and high compactness can be prepared by exposure to light only once. This is because the organic component and inorganic component of the photosensitive paste composition of embodiments of the present invention each have an average refractive index of less than 1.5. Thus, there is not a big difference between the average refractive indices of the organic and inorganic components of the photosensitive paste composition.

According to another embodiment of the present invention, a PDP includes the barrier rib.

Hereinafter, the present invention will be described with reference to the following Examples. The following Examples are presented for illustrative purposes only and are not intended to limit the scope of the invention.

EXAMPLES

Preparation of Photosensitive Paste Compound

Example 1

An organic component of a photosensitive paste compound was prepared by the method of preparing an organic component described above. The organic component included 60 weight % poly(methyl methacrylate-co-butyl methacrylate-co-methyl methacrylic acid) copolymer having a molecular weight of 12,000 g/mol and an acid value of 150 mgKOH/g as the first binder. The organic component also included 2 weight % hydroxypropyl cellulose having an average molecular weight Mw of 80,000 g/mol as the second binder. The organic component further included 1.5 weight % 2-methyl-1-[4-(methylthio)phenyl]-2-morpholinopropan-1-one as the first photo initiator. In addition, the organic component included 0.5 weight % 2,4-diethylthioxantone as the second photo initiator. The organic component also included 25 weight % methoxydiethyleneglycol acrylate as the first cross-linking agent. Additionally, the organic component included 10 weight % trimethylolpropane triacrylate as the second cross-linking agent. The organic component also included 1 weight % malonic acid as a storage stabilizer. Finally, a solvent (texanol) was used for dissolution and viscosity adjustment in an amount of 20 parts by weight with respect to 100 parts by weight of the organic component.

The prepared organic component was coated on a glass substrate, and dried at 100° C. for 10 minutes. The refractive index was measured using a refractive index measuring device (20° C., sodium D line) and was 1.47.

A photosensitive paste composition was prepared by the above-described method using 40 volume % of the prepared organic component (solvent excluded), 50 volume % of a glass frit ($SiO_2$—$B_2O_3$—$Al_2O_3$ based, amorphous, $D_{50}$=3.2 μm, refractive index=1.50), and 10 volume % of a filler ($SiO_2$—$B_2O_3$—CaO based, amorphous, $D_{50}$=2.5 μm, refractive index=1.40) (average refractive index of inorganic component=1.48).

Example 2

A photosensitive paste composition was prepared as in Example 1, except that the glass frit was $SiO_2$—$B_2O_3$—$Al_2O_3$—F based (amorphous, $D_{50}$=3.4 μm, refractive index=1.47), and the filler was $SiO_2$—$Al_2O_3$—BaO based (amorphous, $D_{50}$=2.3 μm, refractive index=1.46) (average refractive index of inorganic component=1.47).

Comparative Example 1

An organic component of a photosensitive paste compound was prepared by the method described above. The organic component included 62 weight % poly(2,4,6-tribromophenyl methacrylate-co-butylmethacrylate-co-methyl methacrylic acid) copolymer having a molecular weight of 8,000 g/mol and an acid value of 150 mgKOH/g as a binder. The organic component also included 1.5 weight % 2-methyl-1-[4-(methylthio)phenyl]-2-morpholinopropan-1-one as the first photo initiator. In addition, the organic component included 0.5 weight % 2,4-diethylthioxantone as the second photo initiator. The organic component further included 35 weight % bisphenol A modified epoxy diacrylate as a cross-linking agent, and 1 weight % malonic acid as a storage stabilizer. Finally, a solvent (texanol) was used for dissolution and viscosity adjustment in an amount of 20 parts by weight with respect to 100 parts by weight of the organic component.

The prepared organic component was coated on a glass substrate, and dried at 100° C. for 10 minutes. The refractive index was measured using a refractive index measuring device (20° C., sodium D line) and was 1.58.

A photosensitive paste composition was prepared using 40 volume % of the prepared organic component (solvent excluded), 50 volume % of a glass frit ($SiO_2$—$B_2O_3$—BaO based, amorphous, $D_{50}$=3.3 μm, refractive index=1.58), and 10 volume % of a filler ($SiO_2$—$B_2O_3$—BaO based, amorphous, $D_{50}$=2.7 μm, refractive index=1.57) (average refractive index of inorganic component=1.57).

Performance Measurement

The photosensitive paste compositions of Examples 1 and 2 and Comparative Example 1 were each coated on a 6" glass substrate using a coater, and then dried in a dry oven at 100° C. for 30 minutes. Subsequently, 300-700 $mJ/cm^2$ of light was irradiated using a high voltage mercury lamp ultraviolet exposure device equipped with a photomask having a stripe pattern (width=50 μm, pitch=200 μm). The light-irradiated glass substrate was developed by spraying it with 0.4% by weight of aqueous $NaCO_3$ solution at 30° C. at a nozzle pressure of 1.5 $kgf/cm^2$ for 120 seconds. The glass was then rinsed by spraying pure water at room temperature at a nozzle pressure of 1.0 $kgf/cm^2$ for 30 seconds. Subsequently, the developed glass substrate was dried using an air knife and then placed into an electric furnace and sintered at 560° C. for 20 minutes to form a barrier rib. Then, the formed barrier rib was evaluated using an optical microscope.

The evaluation results of the barrier ribs are shown in Table 1 below. In Table 1, exposure amount is a value that denotes optimum pattern results.

TABLE 1

|  | Example 1 | Example 2 | Comparative Example 1 |
|---|---|---|---|
| Exposure amount (mJ/cm2) | 650 | 400 | 400 |
| Thickness before sintering (μm) | 180 | 180 | 180 |
| Upper width before sintering (μm) | 60 | 50 | 50 |
| Lower width before sintering (μm) | 70 | 80 | 80 |
| Thickness after sintering (μm) | 115 | 115 | 125 |
| Upper width after sintering (μm) | 50 | 40 | 45 |
| Lower width after sintering (μm) | 55 | 60 | 65 |
| Film compactness after sintering (%) | 98 | 98 | 92 |
| Barrier rib color after sintering | Light gray | Light gray | Black gray |

Referring to Table 1, barrier rib colors were observed by the naked eye, surface compactness was observed using a scanning electron microscope (SEM), and the value of surface compactness (%) represents the percentage of the unit area of a cross-section of a barrier rib that does not contain empty space. That is, when the surface compactness is 100%, empty space does not exist, indicating that a compacted barrier rib is formed.

From the results of Table 1, it can be seen that the barrier ribs prepared using the photosensitive paste compositions of Examples 1 and 2 have thickness shrinkage ratios of 36% and good compactness on sintering. In contrast, the barrier rib prepared using the photosensitive paste composition of Comparative Example 1 has a thickness shrinkage ratio of 31% and reduced compactness on sintering as compared to the photosensitive paste compositions of Examples 1 and 2. This is believed to be because the binder used in Comparative Example 1 had such bad thermal decomposition properties that it was insufficiently degraded during sintering, and because sintering was insufficiently performed due to impact. Also, a comparison of the color of the barrier rib of Comparative Example 1 (i.e., relatively black) with the color of the barrier ribs of Examples 1 and 2 lead to the same conclusions. The black color of the barrier rib of Comparative Example 1 shows that the organic component was insufficiently degraded. In Table 1, the barrier rib prepared using the photosensitive paste composition of Example 1 has reduced light exposure sensitivity, has a wider upper width, and has a narrower lower width compared with the barrier rib prepared using the photosensitive paste composition of Example 2. This is because the difference between the refractive indices of the glass frit and the filler used in Example 1 is relatively large compared to the difference in Example 2. Thus, light transmittance is reduced during exposure to light.

According to embodiments of the present invention, an organic component is used that is not harmful to the human body, is inexpensive, generally easily obtained, and succumbs readily to thermal decomposition. Also, a barrier rib of a PDP having high resolution and high compactness by exposure to light only once can be prepared.

While the present invention has been illustrated and described with reference to certain exemplary embodiments thereof, it will be understood by those of ordinary skill in the art that various modifications and changes to the described embodiments may be made without departing from the spirit and scope of the present invention as defined by the following claims.

What is claimed is:

1. A photosensitive paste composition comprising:
   an organic component comprising a binder, a cross-linking agent and a photo initiator, the organic component having an average refractive index of less than 1.5; and
   an inorganic component comprising a low melting point glass frit and a high melting point glass fit, the low melting point glass frit having an average refractive index of less than 1.52 and comprising a complex oxide comprising at least three oxides of an element selected from the group consisting of Si, B, Al, Ba, Zn, Mg, Ca, P, V, Mo, Te, and combinations thereof, and the high melting point glass frit having an average refractive index of less than 1.5 such that the inorganic component has an average refractive index of less than 1.5.

2. The photosensitive paste composition of claim 1, wherein the organic component is present in an amount ranging from about 20 to about 70 parts by volume with respect to 100 parts by volume of the photosensitive paste composition.

3. The photosensitive paste composition of claim 1, wherein each of the binder and the cross-linking agent comprises an aliphatic group and does not comprise an aromatic group, each of the binder and cross-linking agent has a refractive index of less than 1.5.

4. The photosensitive paste composition of claim 1, wherein the binder is an acryl-based resin comprising a carboxyl group.

5. The photosensitive paste composition of claim 4, wherein the acryl-based resin comprising a carboxyl group is a copolymer of a monomer comprising a carboxyl group and a monomer comprising an ethylenically unsaturated group,
   wherein the monomer comprising a carboxyl group is selected from the group consisting of acrylic acid, methacrylic acid, fumaric acid, maleic acid, vinylacetic acids, anhydrides thereof, and combinations thereof, and
   wherein the monomer comprising an ethylenically unsaturated group is selected from the group consisting of methyl(meth)acrylate, ethyl(meth)acrylate, n-propyl (meth)acrylate, isopropyl(meth)acrylate, n-butyl(meth)acrylate, sec-butyl(meth)acrylate, isobutyl(meth)acrylate, tert-butyl(meth)acrylate, n-pentyl(meth)acrylate, allyl(meth)acrylate, butoxyethyl(meth)acrylate, butoxytriethyleneglycol(meth)acrylate, cyclohexyl(meth)acrylate, dicyclopentanyl(meth)acrylate, dicyclopentenyl(meth)acrylate, 2-ethylhexyl(meth)acrylate, glycerol(meth)acrylate, glycidyl(meth)acrylate, isobornyl(meth)acrylate, isodecyl(meth)acrylate, isooctyl(meth)acrylate, lauryl(meth)acrylate, 2-methoxyethyl(meth)acrylate, methoxyethyleneglycol(meth)acrylate, methoxydiethyleneglycol(meth)acrylate, stearyl(meth)acrylate, 2-hydroxyethyl(meth)acrylate, 2-hydroxypropyl(meth)acrylate, aminoethyl(meth)acrylate, and combinations thereof.

6. The photosensitive paste composition of claim 5, wherein the binder has a cross-linkable group comprising a reaction product of the carboxylic group of the copolymer and an ethylenically unsaturated compound,
   wherein the ethylenically unsaturated compound is selected from the group consisting of acryloylchloride, methacryloylchloride, allyl chloride, glycidylacrylate, glycidylmethacrylate, 3,4-epoxycyclohexylmethylacrylate, and 3,4-epoxycyclohexylmethylmethacrylate.

7. The photosensitive paste composition of claim 1, wherein the binder further comprises a material selected from the group consisting of cellulose, methylcellulose, ethylcellulose, n-propyl cellulose, hydroxyethyl cellulose, 2-hydroxyethylcellulose, methyl-2-hydroxyethylcellulose, hydroxypropylcellulose, hydroxypropylmethylcellulose, hydroxybutylmethylcellulose, hydroxypropylmethylcellulose phthalate, cellulose nitrate, cellulose acetate, cellulose triacetate, cellulose acetate butyrate, cellulose acetate propionate, (acrylamidomethyl)cellulose propionate, (acrylamidomethyl)cellulose acetate propionate, cellulose acetate butyrate, cyanoethylated cellulose, pectic acid, chitosan, chitin, carboxymethylcellulose, carboxymethylcellulose sodium salt, carboxyethylcellulose, carboxyethylmethylcellulose, and combinations thereof.

8. The photosensitive paste composition of claim 5, wherein the copolymer has a weight average molecular weight ranging from about 5,000 to about 50,000 g/mol, and an acid value ranging from about 50 to about 250 mgKOH/g.

9. The photosensitive paste composition of claim 1, wherein the binder is present in the organic component in an amount ranging from about 30 to about 80 parts by weight with respect to 100 parts by weight of the organic component.

10. The photosensitive paste composition of claim 1, wherein the cross-linking agent is selected from the group consisting of mono(meth)acrylate, multi-functional (meth)acrylates, combinations thereof, wherein the mono(meth)acrylate is selected from the group consisting of (meth)acrylic acid, methyl(meth)acrylate, ethyl(meth)acrylate, n-propyl(meth)acrylate, isopropyl (meth)acrylate, n-butyl(meth)acrylate, sec-butyl(meth) acrylate, isobutyl(meth)acrylate, tert-butyl(meth)acrylate, n-pentyl(meth)acrylate, allyl(meth)acrylate, butoxyethyl(meth)acrylate, butoxytriethyleneglycol (meth)acrylate, cyclohexyl(meth)acrylate, dicyclopentanyl(meth)acrylate, dicyclopentenyl(meth)acrylate, 2-ethylhexyl(meth)acrylate, glycerol(meth)acrylate, glycidyl(meth)acrylate, isobornyl(meth)acrylate, isodecyl(meth)acrylate, isooctyl(meth)acrylate, lauryl(meth) acrylate, 2-methoxyethyl(meth)acrylate, methoxyethyleneglycol(meth)acrylate, methoxydiethyleneglycol (meth)acrylate, stearyl(meth)acrylate, 2-hydroxyethyl (meth)acrylate, 2-hydroxypropyl(meth)acrylate, aminoethyl(meth)acrylate, and combinations thereof, and wherein the multi-functional (meth)acrylate is selected from the group consisting of:

di(meth)acrylates selected from the group consisting of 1,6-hexanediol di(meth)acrylate, (ethoxylated) 1,6-hexanediol di(meth)acrylate, 1,4-butanediol di(meth) acrylate, 2-butyl-2-ethyl-1,3-propanediol di(meth) acrylate, 1,9-nonanediol di(meth)acrylate, tripropyleneglycol di(meth)acrylate, dipropyleneglycol di(meth)acrylate, tetraethyleneglycol di(meth) acrylate, and combinations thereof;

tri(meth)acrylates selected from the group consisting of trimethylolpropane tri(meth)acrylate, (ethoxylated) trimethylolpropane tri(meth)acrylate, (propoxylated) glycerin tri(meth)acrylate, pentaerithritol tri(meth) acrylate, (propoxylated) trimethylolpropane-3-tri (meth)acrylate, and combinations thereof;

tetra(meth)acrylates selected from the group consisting of ditrimethylolpropane tetra(meth)acrylate, tetramethylolpropane tetra(meth)acrylate, pentaerithritol tetra(meth)acrylate, and combinations thereof;

penta(meth)acrylates;

dipentaerithritol hexa(meth)acrylate; and mixtures thereof.

11. The photosensitive paste composition of claim 1, wherein the cross-linking agent is present in the organic component in an amount ranging from about 15 to about 60 parts by weight with respect to 100 parts by weight of the organic component.

12. The photosensitive paste composition of claim 1, wherein the photo initiator is selected from the group consisting of benzophenone, o-benzoyl benzoic acid methyl ester, 4,4-bis(dimethylamine)benzophenone, 4,4-bis(diethylamino)benzophenone, 2,2-diethoxyacetophenone, 2,2-dimethoxy-2-phenyl-2-phenylacetophenone, 2-methyl-[4-(methylthio)phenyl]-2-morpholinopropan-1-one, 2-benzyl-2-dimethylamino-1-(4-morpholinophenyl)-butan-1-one, bis (2,6-dimethoxybenzoyl)-2,4,4-trimethylpentylphosphineoxide, bis(2,4,6-trimethylbenzoyl) phenylphosphineoxide, and combinations thereof.

13. The photosensitive paste composition of claim 1, wherein the photo initiator is present in the organic component in an amount ranging from about 1 to about 20 parts by weight with respect to 100 parts by weight of the organic component.

14. The photosensitive paste composition of claim 1, wherein the organic component further comprises an additive selected from the group consisting of sensitizers, polymerization inhibitors, antioxidants, ultraviolet absorbents, anti-foaming agents, dispersants, leveling agents, plasticizers, thixotropic agents, and combinations thereof.

15. The photosensitive paste composition of claim 1, wherein the organic component comprises a solvent having a boiling point of at least about 150° C.

16. The photosensitive paste composition of claim 15, wherein the solvent is selected from the group consisting of ethyl carbitol, butyl carbitol, ethyl carbitol acetate, butyl carbitol acetate, texanol, terpine oil, diethylene glycol, dipropylene glycol, tripropylene glycol, dipropyleneglycol methylether, dipropyleneglycol ethylether, dipropyleneglycol monomethylether acetate, γ-butyrolactone, cellosolve acetate, butyl cellosolve acetate, and combinations thereof.

17. The photosensitive paste composition of claim 1, wherein the inorganic component is present in an amount ranging from about 30 to about 80 parts by volume with respect to 100 parts by volume of the photosensitive paste compound.

18. The photosensitive paste composition of claim 1, wherein the low melting point glass frit is selected from the group consisting of $SiO_2$—$B_2O_3$—$Al_2O_3$ based glasses, $SiO_2$—$B_2O_3$—$BaO$ based glasses, $SiO_2$—$B_2O_3$—$CaO$ based glasses, $ZnO$—$B_2O_3$—$Al_2O_3$ based glasses, $ZnO$—$SiO_2$—$B_2O_3$ based glasses, $P_2O_5$ based glasses, $SnO$—$P_2O_5$ based glasses, $V_2O_5$—$P_2O_5$ based glasses, $V_2O_5$—$Mo_2O_3$ based glasses, $V_2O_5$—$P_2O_5$—$TeO_2$ based glasses, $SiO_2$—$B_2O_3$—$Al_2O_3$—F based glasses, $SiO_2$—$B_2O_3$—$BaO$—F based glasses, $SiO_2$—$B_2O_3$—$CaO$—F based glasses, $ZnO$—$B_2O_3$—$Al_2O_3$—F based glasses, $ZnO$—$SiO_2$—$B_2O_3$—F based glasses, $P_2O_5$—F based glasses, $SnO$—$P_2O_5$—F based glasses, $V_2O_5$—$P_2O_5$—F based glasses, $V_2O_5$—$Mo_2O_3$—F based glasses, $V_2O_5$—$P_2O_5$—$TeO_2$—F based glasses, and combinations thereof.

19. The photosensitive paste composition of claim 1, wherein a particle diameter of the low melting point glass frit has a median value ($D_{50}$) ranging from about 2 to about 5 μm, a minimum value ($D_{min}$) of about 0.1 μm or greater, and a maximum value ($D_{max}$) of about 20 μm or smaller.

20. The photosensitive paste composition of claim 1, wherein the low melting point glass frit is present in an amount ranging from about 60 to about 95 parts by volume with respect to 100 parts by volume of the inorganic component.

21. A photosensitive paste composition comprising:

an organic component comprising a binder, a cross-linking agent and a photo initiator, the organic component having an average refractive index of less than 1.5; and an inorganic component comprising a low melting point glass frit and a high melting point glass frit, the low melting point glass frit having an average refractive index of less than 1.52 and the high melting point glass frit having an average refractive index of less than 1.5 and comprising a complex oxide comprising at least two oxides of elements selected from the group consisting of Si, B, Al, Ba, Zn, Mg, Ca, and combinations thereof, such that the inorganic component has an average refractive index of less than 1.5.

22. The photosensitive paste composition of claim 21, wherein the high melting point glass frit is selected from the group consisting of $SiO_2$—$B_2O_3$ based glasses, $SiO_2$—$B_2O_3$—$Al_2O_3$ based glasses, $SiO_2$—$B_2O_3$—$BaO$ based glasses, $SiO_2$—$B_2O_3$—$CaO$ based glasses, $SiO_2$—$B_2O_3$—$MgO$ based glasses, $SiO_2$—$Al_2O_3$—$BaO$ based glasses, $SiO_2$—$Al_2O_3$—$CaO$ based glasses, $SiO_2$—$Al_2O_3$—$MgO$ based glasses, and combinations thereof.

23. The photosensitive paste composition of claim 1, wherein a particle diameter of the high melting point glass frit has a median value ($D_{50}$) ranging from about 1 to about 4 μm, a minimum value ($D_{min}$) of about 0.1 μm or greater, and a maximum value ($D_{max}$) of about 20 μm or smaller.

24. The photosensitive paste composition of claim 1, wherein the high melting point glass frit is present in an amount ranging from about 5 to about 40 parts by volume with respect to 100 parts by volume of the inorganic component.

25. A barrier rib of a plasma display panel comprising a photosensitive paste composition according to claim 1.

26. A plasma display panel comprising a barrier rib according to claim 25.

* * * * *

UNITED STATES PATENT AND TRADEMARK OFFICE
CERTIFICATE OF CORRECTION

| | | |
|---|---|---|
| PATENT NO. | : 8,198,003 B2 | Page 1 of 1 |
| APPLICATION NO. | : 12/039665 | |
| DATED | : June 12, 2012 | |
| INVENTOR(S) | : Beom-Wook Lee | |

It is certified that error appears in the above-identified patent and that said Letters Patent is hereby corrected as shown below:

In the Claims

Column 11, Claim 1, line 50          Delete "fit"
                                     Insert -- FRIT --

Signed and Sealed this
Fourth Day of March, 2014

Michelle K. Lee
*Deputy Director of the United States Patent and Trademark Office*